(12) United States Patent
Ebrahimzad et al.

(10) Patent No.: US 11,552,736 B1
(45) Date of Patent: Jan. 10, 2023

(54) SYSTEMS AND METHODS FOR ENCODING DIGITAL COMMUNICATIONS

(71) Applicant: HUAWEI TECHNOLOGIES CO., LTD., Guangdong (CN)

(72) Inventors: Hamid Ebrahimzad, Kanata (CA); Ali Farsiabi, Ottawa (CA); Zhuhong Zhang, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/401,756

(22) Filed: Aug. 13, 2021

(51) Int. Cl.
*H04L 1/00* (2006.01)
*H03M 13/27* (2006.01)
*H03M 13/13* (2006.01)

(52) U.S. Cl.
CPC ........ *H04L 1/0071* (2013.01); *H03M 13/275* (2013.01); *H04L 1/0057* (2013.01); *H03M 13/134* (2013.01); *H04L 1/0041* (2013.01)

(58) Field of Classification Search
CPC ............................ H04L 1/0071; H03M 13/275
See application file for complete search history.

(56) References Cited

U.S. PATENT DOCUMENTS 8,611,335 B1 * 12/2013 Wu .................. H04L 47/41
370/392
2016/0269050 A1 9/2016 Shen et al.
(Continued)

FOREIGN PATENT DOCUMENTS

| CN | 111342934 A | 6/2020 |
|---|---|---|
| CN | 112511226 A | 3/2021 |
| CN | 113067676 A | 7/2021 |

OTHER PUBLICATIONS

Arikan, "Channel polarization: A method for constructing capacity achieving codes for symmetric binary-input memoryless channels", IEEE Trans. Inf. Theory, vol. 55, pp. 3051-3073, Jul. 2009.
(Continued)

*Primary Examiner* — Joseph D Torres
(74) *Attorney, Agent, or Firm* — BCF LLP (57) ABSTRACT

The disclosed systems and methods for encoding, by a polar encoder, K message bits into an encoded message bits sequence C(M) using polar codes, where K and M are integer values and M is greater than or equal to K; rearranging, by an interleaver, the encoded message bits sequence C(M) to rearranged encoded message bits sequence C'(M) such that a C(i)th bit and a

$$C\left(\frac{M}{2} + i\right)$$

th bit of the encoded message bits sequence C(M) are arranged together, where i is an integer value that varies between 1 to $$\frac{M}{2};$$

mapping, by a bits-to-symbol mapper, the rearranged encoded message bits sequence C(M) to N non-binary symbols, where N is an integer value; and processing, by a transmitter symbol processor, the N non-binary symbols to transmit the processed non-binary symbols towards a receiver.

16 Claims, 6 Drawing Sheets

(56) References Cited

U.S. PATENT DOCUMENTS

| | | | |
|---|---|---|---|
| 2017/0338996 A1* | 11/2017 | Sankar | H04L 1/0071 |
| 2018/0331693 A1* | 11/2018 | Lou | H04L 1/0072 |
| 2019/0181983 A1* | 6/2019 | Ye | H04L 1/0013 |
| 2020/0092048 A1* | 3/2020 | Hong | H04L 5/0055 |
| 2020/0220652 A1 | 7/2020 | Son et al. | |
| 2021/0036805 A1* | 2/2021 | Kim | H03M 13/251 |

OTHER PUBLICATIONS

Tal et al., "List decoding of polar codes", IEEE Trans. IT, vol. 61, No. 5, pp. 2213-2226, Mar. 2015.

El-Khamy et al., "Relaxed polar codes", IEEE Trans. IT, vol. 63, No. 4, pp. 1986-2000, Apr. 2017.

Koike-Akino et al., "Irregular Polar Coding for Complexity-Constrained Lightwave Systems", Journal of lightwave tech, vol. 36, No. 11, 2018.

Sarkis et al., "Fast polar decoders: Algorithm and implementation", IEEE J. Sel. Areas Commun.,vol. 32, No. 5, pp. 946-957, May 2014.

Hanif et al., "Fast successive-cancellation decoding of polar codes: Identification and decoding of new nodes", IEEE Commun. Lett, vol. 21, No. 11, pp. 2360-2363, Nov. 2017.

Hashemi et al., "Simplified successive cancellation list decoding of polar codes", IEEE Int. Symp. on Inform. Theory, Jul. 2016, pp. 815-819.

Mahdavifar et al., "Polar Coding for Bit-Interleaved Coded Modulation", IEEE Transactions on Vehicular Technology, Jan. 2015.

Zehavi, "8-PSK trellis codes for a Rayleigh channel", IEEE Trans. Commun., vol. 40, No. 5, pp. 873-884, May 1992.

Caire et al., "Bit-interleaved coded modulation", IFFF Trans. Inf. Theory, vol. 44, No. 3, pp. 927-946, May 1998.

Barakatain et al., "Performance-Complexity Tradeoffs of Concatenated FEC for Higher-Order Modulation", Journal of Lightwave Technology, vol. 38, No. 11, pp. 2944-2953, Jun. 2020.

Xiaoming Jiang et al., Multi-RS Concatenated Polar Codes with Enhanced Interleaving and List Decoding, IEEE Xplore, Aug. 27-30, 2018, 5 pages.

Eurecom et al., Low-PAPR Sequence-Based Approaches for PUCCH Coverage Enhancement, 3GPP TSG-RAN WG1 Meeting #103, e-Meeting, Oct. 26-Nov. 13, 2020, 13 pages.

International Search Report of PCT/CN2022/111489; Xiangchao Niu, dated Nov. 8, 2022.

\* cited by examiner

402 — encoding, by a polar encoder, K message bits into an encoded message bits sequence C(M) using polar codes, where K and M are integer values and M is greater than or equal to K 404 — rearranging, by and interleaver, the encoded message bits sequence C(M) to rearranged encoded message bits sequence C'(M) such that a C(i)th bit and a $C(\frac{M+i}{2})$th bit of encoded message bits sequence C(M) are arranged together, where i is an integer value that varies between 1 to $\frac{M}{2}$ 406 — mapping, by a bits-to-symbol mapper, the rearranged encoded message bits sequence C(M) to N non-binary symbols, where N is an integer value 408 — processing, by a transmitter symbol processor, the N non-binary symbols to transmit the processed non-binary symbols towards a receiver

SYSTEMS AND METHODS FOR ENCODING DIGITAL COMMUNICATIONS

CROSS-REFERENCE TO RELATED APPLICATIONS

This is the first application filed for the instantly disclosed technology.

TECHNICAL FIELD

The present disclosure generally relates to digital communications and, in particular, to a system and a method for encoding digital communications.

BACKGROUND

Typically, forward error correction codes (FECs) are used for channel encoding of communication systems to provide a reliable communication by adding redundancy. There are many techniques for designing FECs and we have many different types of FECs (e.g., Algebraic Code, convolutional turbo code, Low-density parity-check (LDPC) code and Turbo product codes (TPC)). A relatively new channel encoding method called "polar coding" is a coding technique that forms polarized virtual "bit-channels" using a class of block codes that contain polar codes. The bit channels are categorized into "good channels" or "information bit channels" in which information may be transmitted with high reliability, and "bad channels" or "frozen bit channels" which are considered or determined to be low reliability channels.

A polar coding method may substantially achieve the Shannon channel capacity, i.e., the highest information rate achievable with arbitrary small error probability, by using low encoding/decoding complexity.

In high-throughput communication systems in some applications, FEC blocks consume more than half of the power of the Digital Signal Processing (DSP) component(s) of a communication system. To this end, there is an interest in designing the FEC with high coding gain and low power consumption.

SUMMARY

Developers of the present technology have devised systems and methods that improves encoding digital communication in terms of coding gain and power consumption.

Various non-limiting embodiments of the present disclosure takes into account the non-binary symbol characteristic and the correlation of noise that has affected the bits from a transmitted non-binary symbol during the design phase. The de-interleaver on the receiver side may keep this noise correlation and the polar decoder may benefit from this correlation, In accordance with a first broad aspect of the present disclosure, there is provided a communication system comprising: a transmitter including: a polar encoder configured to encode K message bits u(K) into an encoded message bits sequence C(M) using polar codes, where K and M are integer values and M is greater than or equal to K; an interleaver configured to rearrange the encoded message bits sequence C(M) to generate rearranged encoded message bits sequence C'(M) such that a C(i)th bit and a $$C\left(\frac{M}{2}+i\right)$$

th bit of the encoded message bits sequence C(M) are arranged together, where i is an integer value that varies between 1 to $$\frac{M}{2};$$

a bits-to-symbol mapper configured to map the rearranged encoded message bits sequence C'(M) to N non-binary symbols, where N is an integer value; and a transmitter symbol processor configured to process the N non-binary symbols to transmit the N processed non-binary symbols towards a receiver.

Thus, by virtue of rearrangement of the encoded message bits sequence C(M) and mapping of the rearranged encoded message bits sequence C'(M) to N non-binary symbols a better bit error rate (BER) may be achieved as compared to conventional techniques.

In accordance with other embodiments of the present disclosure, the communication system, wherein the transmitter symbol processor is further configured to modulate the N non-binary symbols.

In accordance with other embodiments of the present disclosure, the communication system, wherein the processed N non-binary symbols are transmitted over a wireless medium.

In accordance with other embodiments of the present disclosure, the communication system, wherein the processed N non-binary symbols are transmitted over an optical medium.

In accordance with other embodiments of the present disclosure, the communication system further comprising a receiver, the receiver including: a receiver symbol processor configured to receive the N processed non-binary symbols and extract the N non-binary symbols; a symbols-to-log-likelihood ratio (LLR) convertor configured to convert the N non-binary symbols to M LLRs, where the M LLRs are real values; a deinterleaver configured to rearrange the M LLRs in such a manner that the M rearranged LLRs correspond to the encoded message bits sequence C(M); and a polar decoder configured to decode the M rearranged LLRs and generate K bits manifesting the K message bits.

In accordance with other embodiments of the present disclosure, the communication system, wherein at least some of bit channels associated with the polar encoder are frozen bit channels and remaining bit channels are information bit channels.

In accordance with other embodiments of the present disclosure, the communication system, wherein the information bit channels are used for encoding the K message bits and no information bit is mapped onto the frozen bit channels.

In accordance with other embodiments of the present disclosure, the communication system, wherein the frozen bit channels and the information bit channels are selected based on a selection process.

In accordance with other embodiments of the present disclosure, the communication system, wherein the selection process includes: operating the communication system in offline mode; selecting M offline codewords as output of the polar encoder, such that when the M offline codewords are converted to N offline non-binary symbols, by the bits-to-symbol mapper, an average power of the N offline non-binary symbols is equals to an average power of the N available non-binary symbols with the bits-to-symbol mapper; processing, by the transmitter symbol processor, the N offline non-binary symbols and transmitting the N processed offline non-binary symbols towards the receiver; extracting, by the receiver symbol processor, the N offline non-binary symbols from the N processed offline non-binary symbols; converting, by the symbols-to-LLR convertor, the N offline non-binary symbols to M offline LLRs; decoding, by the polar decoder, the M offline LLRs and generating M offline bits such that the M offline bits correspond to M offline message bits; computing probability of errors corresponding to the bit channels associated with the polar encoder based on a noise correlation between the M offline LLRs; and selecting, by the polar decoder, K bit channels having a lower the probability of errors than M-K bit channels as the information bit channels and remaining M-K bit channels are selected as frozen bit channels.

It is to be noted that since the non-binary symbol characteristic and the correlation of noise that has affected the bits from a transmitted non-binary symbol were considered during the design phase (i.e., while operating the communication system in offline mode), the frozen bit channels and information bit channels may be selected in an efficient manner. To this end, the data transmitted over the information bit channels may result in a lower probability of error. In other words, a better BER may be achieved as compared to the conventional techniques.

In accordance with other embodiments of the present disclosure, the communication system, wherein the receiver symbol processor is further configured to demodulate the N non-binary symbols.

In accordance with a second broad aspect of the present disclosure, there is provided method of communication comprising: encoding, by a polar encoder, K message bits into an encoded message bits sequence C(M) using polar codes, where K and M are integer values and M is greater than or equal to K; rearranging, by an interleaver, the encoded message bits sequence C(M) to rearranged encoded message bits sequence C'(M) such that a C(i)th bit and a $$C\left(\frac{M}{2}+i\right)$$

th bit of the encoded message bits sequence C(M) are arranged together, where i is an integer value that varies between 1 to $$\frac{M}{2};$$

mapping, by a bits-to-symbol mapper, the rearranged encoded message bits sequence C(M) to N non-binary symbols, where N is an integer value; and processing, by a transmitter symbol processor, the N non-binary symbols to transmit the processed non-binary symbols towards a receiver.

In accordance with other embodiments of the present disclosure, the method further comprising modulating the N non-binary symbols.

In accordance with other embodiments of the present disclosure, the method further comprising transmitting the processed non-binary symbol over a wireless medium.

In accordance with other embodiments of the present disclosure, the method further comprising transmitting the processed symbol over an optical medium.

In accordance with other embodiments of the present disclosure, the method further comprising: receiving, by a receiver symbol processor, the N processed non-binary symbols; extracting by the receiver symbol processor, the N non-binary symbols from the N processed non-binary symbols; converting, by a symbols-to-log-likelihood ratio (LLR), the N non-binary symbols to M LLRs, where the M LLRs are real; rearranging, by a deinterleaver, the M LLRs in such a manner that the M rearranged LLRs correspond to the encoded message bits sequence C(M); and decoding, by a polar decoder, the M rearranged LLRs and generate K bits manifesting the K message bits.

In accordance with other embodiments of the present disclosure, the method, wherein at least some of bit channels associated with the polar encoder are frozen bit channels and remaining bit channels are information bit channels.

In accordance with other embodiments of the present disclosure, the method, wherein the information bit channels are used for encoding the K message bits and no information bit is mapped onto the frozen bit channels.

In accordance with other embodiments of the present disclosure, the method, wherein the frozen bit channels and the information bit channels are selected based on a selection process.

In accordance with other embodiments of the present disclosure, the method, wherein the selection process includes: operating the communication system in offline mode; selecting M offline codewords as output of the polar encoder, such that when the M offline codewords are converted to N offline non-binary symbols, by the bits-to-symbol mapper, an average power of the N offline non-binary symbols is equals to an average power of the N available non-binary symbols with the bits-to-symbol mapper; processing, by the transmitter symbol processor, the N offline non-binary symbols and transmitting the N processed offline non-binary symbols towards the receiver; extracting, by the receiver symbol processor, the N offline non-binary symbols from the N processed offline non-binary symbols; converting, by the symbols-to-LLR convertor, the N offline non-binary symbols to M offline LLRs; decoding, by the polar decoder, the M offline LLRs and generating M offline bits such that the M offline bits correspond to M offline message bits; computing probability of errors corresponding to the bit channels associated with the polar encoder based on a noise correlation between the K offline LLRs; and selecting, by the polar decoder, K bit channels having a lower the probability of errors than M-K bit channels as the information bit channels and remaining M-K bit channels are selected as frozen bit channels.

In accordance with other embodiments of the present disclosure, the method, wherein the receiver symbol processor is further configured to demodulate the N non-binary symbols.

BRIEF DESCRIPTION OF THE FIGURES

Further features and advantages of the present disclosure will become apparent from the following detailed description, taken in combination with the appended drawings, in which.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current technology. In particular, the instant disclosure describes systems and methods for encoding digital communications.

Unless otherwise defined or indicated by context, all technical and scientific terms used herein have the same meaning as commonly understood by one of ordinary skill in the art to which the described embodiments appertain to.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the server, nor is their use (by itself) intended to imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

In the context of the present disclosure, the expression "data" includes data of any nature or kind whatsoever capable of being stored in a database. Thus, data includes, but is not limited to, audiovisual works (images, movies, sound records, presentations etc.), data (location data, numerical data, etc.), text (opinions, comments, questions, messages, etc.), documents, spreadsheets, etc.

Software modules, modules, or units which are implied to be software, may be represented herein as any combination of flowchart elements or other elements indicating performance of process steps and/or textual description. Such modules may be executed by hardware that is expressly or implicitly shown.

With these fundamentals in place, the instant disclosure is directed to address at least some of the deficiencies of the current technology. In particular, the instant disclosure describes systems and methods for encoding digital communications.

Figure 1:
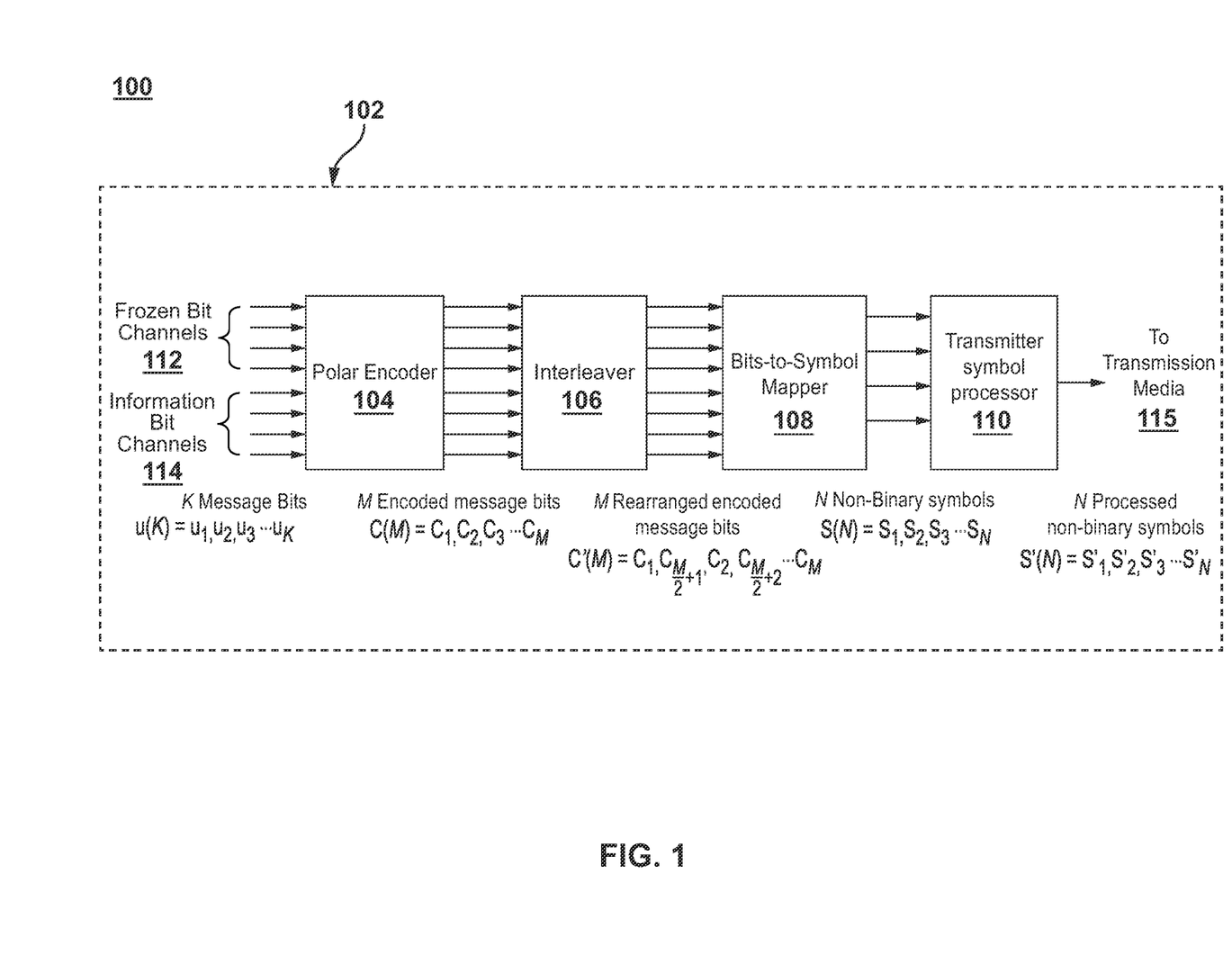
FIGS. 1 and 2 illustrate respective transmitter and receiver portions a high-level functional block diagram of a communication system in accordance with various non-limiting embodiments of the present disclosure.
Figure 2:
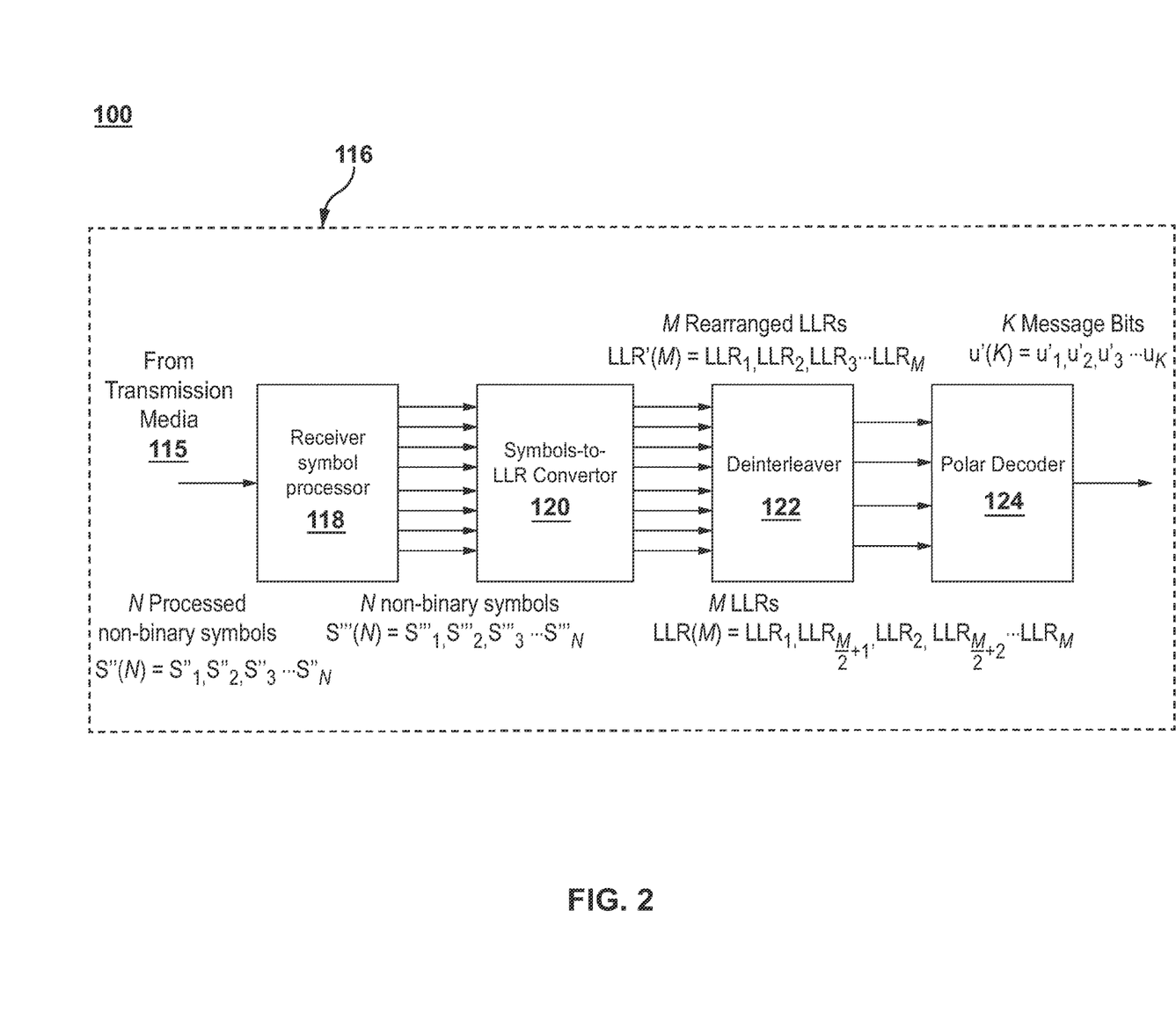

FIGS. 1 and 2 illustrate respective transmitter and receiver portions of a high-level functional block diagram of a communication system 100 in accordance with various non-limiting embodiments of the present disclosure. As shown in FIG. 1, the communication system 100 may include a transmitter 102. The transmitter 102 may include a polar encoder 104, an interleaver 106, a bits-to-symbol mapper 108, and a transmitter symbol processor 110.

As shown in FIG. 2, the communication system 100 may further include a receiver 116. The receiver 116 may include a receiver symbol processor 118, a symbols-to-log likelihood ratio (LLR) convertor 120, a deinterleaver 122, and a polar decoder 124. It is to be noted that the communication system 100 may include other modules and components such as processors and controllers. However, for the purposes of simplicity, such modules and components have been omitted from FIGS. 1 and 2.

There may be a plurality of bit channels associated with the polar encoder 104. For example, in FIG. 1 the polar encoder 104 may have M bit channels. Based on the rate of the code K bits channels may be selected as information bit channels 114 and rest of the bit channels (M-K) may be frozen bit channels 112. As discussed below, based on a performance of the plurality of bit channels, at least some of the bit channels may be referred to as "frozen bit channels" 112 (as shown in FIG. 1) while other bit channels may be referred to as information bit channels 114 (as shown in FIG. 1). In certain non-limiting embodiments, the frozen bit channels 112 may be referred to as those channels over which transmission of message bits is least preferred and information bit channels 114 may be referred to a preferable channel over which the message bits may be transmitted. In certain non-limiting embodiments, the communication system 100 may be configured to select the frozen bit channels 112 and information bit channels 114 in accordance with a selection process.

Figure 3:
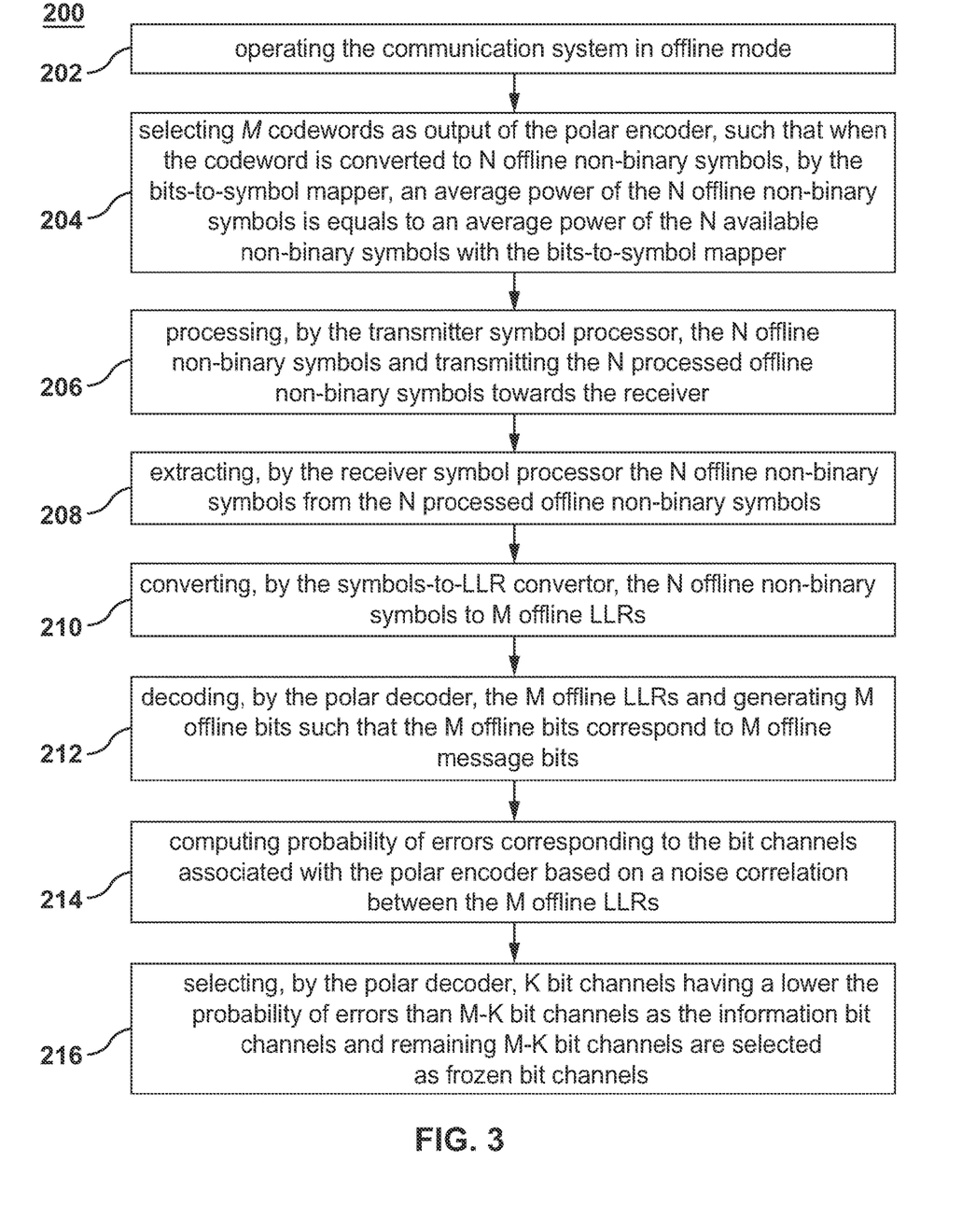
FIG. 3 illustrates a flowchart of a process implemented over the communication system for selecting the information bits channels, in accordance with various non-limiting embodiments of the present disclosure.

FIG. 3 illustrates a flowchart of a process 200 implemented over the communication system 100 for selecting the information bit channels 114 and the frozen bit channels 112, in accordance with various non-limiting embodiments of the present disclosure. As shown, the process 200 commences at step 202 where the communication system 100 is operated in offline mode. In other words, the transmitter 102 and the receiver 116 may be operated on M offline message bits generated by the communication system 100 where M is an integer value.

In certain non-limiting embodiments, the output of the polar encoder 104 may be represented as follows:

$$C(M) = u \cdot G \tag{1}$$

Where u is an input matrix including M message bits u(M)=u(1), u(2), . . . u(M). The overall length of the input matrix u may be equal to M, where M may represent the length of the codewords of the polar codes. Also, G is a generator matrix of dimension M×M represented as:

$$G = \begin{bmatrix} 1 & 0 \\ 1 & 1 \end{bmatrix}^{\otimes n} \tag{2}$$

Where ⊗ n represents a kronecker power.

While performing the polar encoding the generator matrix G may polarize the bits in a manner that the bit capacity of at least some of the bit channels associated with the polar encoder 104 goes to 1 and remaining channels may have a zero capacity. Based on the required rate $$R = \frac{K}{M},$$

the message bits may be transmitted over the bit channels with high capacity (e.g., 1) and no information may be transmitted over the bit channels with low capacity (e.g., 0). The bit channels may be segregated as frozen bit channels 112 and information bit channels 114 based on the process 200.

The process 200 advances to step 204 where the communication system 100 selects M offline codewords as output of the polar encoder 104. In certain non-limiting embodiments, the communication system 100 may compute M offline message bits using equation (1).

In some of the non-limiting embodiments, the M offline codewords selected during the offline mode of operation of the communication system 100 may be rearranged by the interleaver 106 and then the rearranged M offline codewords are forwarded to the bits-to-symbol mapper 108.

The bits-to-symbol mapper 108 may be configured to convert the bits of the M offline codewords to N non-binary symbols, where N is an integer number. In certain non-limiting embodiments, the bits-to-symbol mapper 108 may combine more than one bit of the M offline codewords and convert them to non-binary symbols. By way of example, if there are four non-binary symbols (e.g., −3, −1, +1, and +3) as a 4-Pulse Amplitude Modulation (4-PAM) constellation, the bits-to-symbol mapper 108 may perform Gray coding for the conversion. Table 1 illustrates one non-limiting example of the bits-to-symbol mapping.

TABLE 1

| Bits | Symbol |
| --- | --- |
| 11 | −3 |
| 01 | −1 |
| 00 | +1 |
| 10 | +3 |

It is to be noted that the M offline codewords are selected in a manner such that when the M offline codewords are converted to N offline non-binary symbols, by the bits-to-symbol mapper 108, an average power of the N offline non-binary symbols is equals to an average power of the N available non-binary symbols with the bits-to-symbol mapper 108. In the above example with available symbols −3, −1, +1, +3, the average power of the 4 available non-binary symbols may be equal to 5. To this end, the M offline codewords are selected in a manner that the average 4 symbols may be equal to 5 in the above example.

The process 200 advances to step 206, where the transmitter symbol processor 110 processes the N offline non-binary symbols and transmits the N processed offline non-binary symbols towards the receiver 116. In certain non-limiting embodiments, the processing of the N offline non-binary symbols may involve various operations such as modulation or any such operation that prepares the N offline non-binary symbols for transmission. It is to be noted that a transmission medium between the transmitter 102 and the receiver 116 may be a wireless medium, wired medium of optical medium. Depending upon the medium the transmitter symbol processor 110 may process the N offline non-binary symbols. Further, in certain non-limiting embodiments, the communication system 100 may include other hardware components/infrastructure such as antenna elements, optical fibers or the like, to facilitate communication between the transmitter 102 and the receiver 116.

The process 200 proceeds to step 208, where the receiver symbol processor 118 extracts the N offline non-binary symbols from the N processed offline non-binary symbols. In certain non-limiting embodiments, the receiver symbol processor 118 may receive the N processed offline non-binary symbols and demodulate them to extract the N offline non-binary symbols.

The process 200 moves to step 210, where the symbols-to-LLR convertor 120 converts the N offline non-binary symbols to M offline LLRs.

As previously discussed, the M offline codewords are selected in a manner such that an average power of the N associated offline non-binary symbols is equals to an average power of the N available non-binary symbols with the bits-to-symbol mapper 108. To this end, in one non-limiting example, the communication system 100 may select the codewords that contains the same symbols as +1 and +3 in 4-PAM constellation. In process of sending +1 or +3, there may be two different LLRs conditioned to sending +1 or +3.

For any constellation point (+1, +3), there may be two bits (in accordance with 4-PAM constellation with 4 points and 2 bits capacity). Thus, there may be two conditional LLRs for the first bit depending on sending +1 or +3. Let the two conditional LLRs be represented as L11 and L13. L11 may be defined by the following equations:

$$L11 = \log\left(\frac{D11}{N11}\right) \quad (3)$$

$$D11 = \exp\left(-\frac{z^2}{2\sigma^2}\right) + \exp\left(-\frac{(z+2)^2}{2\sigma^2}\right) \quad (4)$$

$$N11 = \exp\left(-\frac{(z-2)^2}{2\sigma^2}\right) + \exp\left(-\frac{(z+4)^2}{2\sigma^2}\right) \quad (5)$$

Where, L11 is the LLR corresponding to the first bit conditioned on sending +1, D11 is the s the probability of bit 1 be zero conditioned on sending +1, and N11 is the is the probability of bit 1 be one conditioned on sending +1, z is the Additive Gaussian noise and $\sigma^2$ is the corresponding variance.

L13 may be defined by the following equations:

$$L13 = \log\left(\frac{D13}{N13}\right) \quad (6)$$

$$D13 = \exp\left(-\frac{(z+4)^2}{2\sigma^2}\right) + \exp\left(-\frac{(z+2)^2}{2\sigma^2}\right) \quad (7)$$

$$N13 = \exp\left(-\frac{(z+6)^2}{2\sigma^2}\right) + \exp\left(-\frac{z^2}{2\sigma^2}\right) \quad (8)$$

Where, L13 is the LLR corresponding to the first bit conditioned on sending +3, D13 is the probability of bit 1 be zero conditioned on sending +3, and N13 is the probability of bit 1 be one conditioned on sending +3, z is the Additive Gaussian noise and $\sigma^2$ is the corresponding variance.

For the second bit, there may be two conditional LLRs depending on sending +1 or +3. Let the two conditional LLRs be represented as L21 and L23. L21 may be defined by the following equations:

$$L21 = \log\left(\frac{D21}{N21}\right) \quad (9)$$

$$D21 = \exp\left(-\frac{z^2}{2\sigma^2}\right) + \exp\left(-\frac{(z \pm 2)^2}{2\sigma^2}\right) \quad (10)$$

$$N21 = \exp\left(-\frac{(z+2)^2}{2\sigma^2}\right) + \exp\left(-\frac{(z+4)^2}{2\sigma^2}\right) \quad (11)$$

Where, L21 is the LLR corresponding to the second bit conditioned on sending +1, D21 is the probability of bit 2 be zero conditioned on sending +1, and N21 is the probability of bit 2 be one conditioned on sending +1, z is the Additive Gaussian noise and $\sigma^2$ is the corresponding variance.

L23 may be defined by the following equations:

$$L23 = \log\left(\frac{D23}{N23}\right) \quad (12)$$

$$D23 = \exp\left(-\frac{z^2}{2\sigma^2}\right) + \exp\left(-\frac{(z+2)^2}{2\sigma^2}\right) \quad (13)$$

$$N23 = \exp\left(-\frac{(z+6)^2}{2\sigma^2}\right) + \exp\left(-\frac{(z+4)^2}{2\sigma^2}\right) \quad (14)$$

Where, L23 is the LLR corresponding to the first bit conditioned on sending +3, D23 is the probability of bit 1 be zero conditioned on sending +3, and N23 is the probability of bit 1 be one conditioned on sending +3, z is the Additive Gaussian noise and $\sigma^2$ is the corresponding variance.

After the symbols-to-LLR convertor 120 has converted all the N offline non-binary symbols to M offline LLRs, the process 200 advances to step 212, where the polar decoder 124 decodes the M offline LLRs and generate K offline bits such that the K offline bits corresponds to K offline message bits. The polar decoder 124 may be a successive cancelation based polar decoder.

In certain non-limiting embodiments, if the M offline codewords were interleaved by the interleaver 106 on the transmitter 102, the deinterleaver 122 may rearrange the M offline LLRs to invert the effects of interleaving prior to polar decoding.

In certain non-limiting embodiments, the polar decoder 124 may rely on successive cancellation (SC) decoding technique along with density evolution. The SC decoding technique uses a binary-tree representation of the polar codes.

In certain non-limiting embodiments, the polar decoder 124 may determine quantization levels corresponding to the LLRs as computed in accordance with the equations 3-14. In certain non-limiting embodiments, the polar decoder 124 may compute the quantization levels based on following equations:

$$Pr(LLR11=q1, LLR21=q2 | sending\ 1) \quad (15)$$

$$Pr(LLR13=q1, LLR23=q2 | sending\ 3) \quad (16)$$

Where q1 and q2 are two quantization levels. It is to be noted that, in certain non-limiting embodiments, bits representing the quantization levels may be finite in number. It is contemplated that the equations 15 and 16 are merely representative and correspond to the examples previously discussed where only symbols +1's and +3's were transmitted, and each symbol was represented by two bits. In other non-limiting embodiments, depending on the number of symbols and bits representing the symbols, there may be a different set of equations without departing from the techniques presented in the present disclosure.

In certain non-limiting embodiments, the polar decoder 124 may combine the two offline LLRs those were used to represent a given symbol by the bits-to-symbol mapper 108. The polar decoder 124 may perform the SC decoding to decode the combined offline LLRs and generate M offline bits such that the M offline bits corresponds to M offline message bits. It is to be noted that the polar decoder 124 may perform the combining operation during the implementing the process 200. During the online operations of the communication system 100, i.e., in practical transmission and reception operations of real-time data, the polar decoder 124 may skip the process of combining the LLRs.

The process 200 advances to step 214, where the polar decoder 124 may compute probability of errors corresponding to the bit channels associated with the polar encoder based on a noise correlation between the M offline LLRs. The polar decoder 124 may compute the probability of error for each bit channel.

Finally, the process 200 advances to step 216 where the communication system 100 selects the K bit channels having a lower the probability of errors than the M-K bit channels as the information bit channels 114 (as shown in FIG. 1) and remaining M-K bit channels are selected as frozen bit channels 112 (as shown in FIG. 1).

Returning to FIG. 1, once the frozen bit channels 112 and the information bit channels 114 are selected by the communication system 100, the communication system 100 may be operated online. In other words, the communication system 100 may be operated with real-time message bits. It is to be noted that in FIG. 1, the frozen bit channels 112 and information bit channels 114 have been illustrated as sequentially consecutive merely to differentiate between the two sets of bit channels. In various no-limiting embodiments, the frozen bit channels 112 and information bit channels 114 may be selected in accordance with the process 200 and may not be consecutive.

In certain non-limiting embodiments, the transmitter 102 may be receive K message bits $u(K)=u_1, u_2, u_3, \ldots u_K$ to be transmitted. The polar encoder 104 may map the K message bits $u(K)=u_1, u_2, u_3, \ldots u_K$ the information bits channels 114. Further in certain non-limiting embodiments, the polar encoder 104 may map 0's onto the frozen bits channels 112. In so doing, even though the length of the message bits is K, the overall length of the input to the polar encoder 104 becomes M. The polar encoder 104 may encode K message bits $u(K)=u_1, u_2, u_3, \ldots u_K$ into an encoded message bits sequence $C(M)=C_1, C_2, C_3, \ldots C_M$ including M encoded message bits. In certain non-limiting embodiments, the polar encoder 104 may rely on equation 1 for encoding. Also, as previously discussed, K and M may be integer values and a of M may be greater or equal to K.

The polar encoder 104 may forward the encoded message bits sequence $C(M)=C_1, C_2, C_3, \ldots C_M$ to the interleaver 106. The interleaver 106 may rearrange the encoded message bits sequence $C(M)=C_1, C_2, C_3, \ldots C_M$ to generate rearranged encoded message bits sequence C'(M). The interleaver 106 may rearrange the encoded message bits sequence C(M) in such a manner that a C(i)th bit and a $$C\left(\frac{M}{2}+i\right)$$

th bit of the encoded message bits sequence C(M) are arranged together, where i may be an integer value that may vary between 1 to $$\frac{M}{2}.$$

By way of example, if there are 16 encoded message bits, rearranged encoded message bits may have a sequence $C'(M)=C_1, C_9, C_2, C_{10} \ldots C_8, C_{16}$ The interleaver 106 may forward the rearranged encoded message bits sequence C'(M) to the bits-to-symbol mapper 108. The bits-to-symbol mapper 108 may map the rearranged encoded message bits sequence C'(M) to N non-binary symbols $S(N)=S_1, S_2, S_3, \ldots S_N$ in accordance with a suitable pulse amplitude modulation technique, where N is an integer value. In one non-limiting embodiment, the bits-to-symbol mapper 108 may rely on 4-PAM technique. By way of an example, the encoded message bits $C_1$ and $C_9$ may be mapped to non-binary symbol $S_1$, the encoded message bits $C_2$ and $C_{10}$ may be mapped to non-binary symbol $S_2$ and so on. Since the mapping technique may be 4-PAM, the different symbols may be −3, −1, +1, and +3. The corresponding bit representation may be 00 for symbol −3, 01 for symbol −1, 10 for symbol +1, and 11 for symbol +3.

The bits-to-symbol mapper 108 may forward the N non-binary symbols $S(N)=S_1, S_2, S_3, \ldots S_N$ to the transmitter symbol processor 110 for processing and transmitting. The transmitter symbol processor 110 may be process the N non-binary symbols $S(N)=S_1, S_2, S_3, \ldots S_N$ to generate N processed non-binary symbols $S'(N)=S'_1, S'_2, S'_3, \ldots S'_N$. In certain non-limiting embodiments, the processing of the N non-binary symbols $S(N)=S_1, S_2, S_3, \ldots S_N$ may involve various operations such as modulation of symbols to high frequency carriers or any such operation that prepares the N non-binary symbols $S(N)=S_1, S_2, S_3, \ldots S_N$ for transmission. It is to be noted that a transmission medium between the transmitter 102 and the receiver 116 may be a wireless medium, wired medium of optical medium. Depending upon the medium the transmitter symbol processor 110 may process the N non-binary symbols $S(N)=S_1, S_2, S_3, \ldots S_N$. Further, in certain non-limiting embodiments, prior to modulation, the transmitter symbol processor 110 may perform up-sampling operation on the N non-binary symbols $S(N)=S_1, S_2, S_3, \ldots S_N$.

The transmitter symbol processor 110 may transmit the N processed non-binary symbols $S'(N)=S'_1, S'_2, S'_3, \ldots S'_N$ to transmission media 115. In certain non-limiting embodiments, the transmission media 115 may be a wireless medium, wired medium or an optical medium without limiting the scope of present disclosure.

Referring now to FIG. 2, the receiver 116 may receive the N processed non-binary symbols $S''(N)=S''_1, S''_2, S''_3, \ldots S''_N$ over the transmission media 115. consecutive The receiver symbol processor 118 may process the received N processed non-binary symbols $S'(N)=S'_1, S'_2, S'_3, \ldots S'_N$ to extract N non-binary symbols $S'''(N)=S'''_1, S'''_2, S'''_3, \ldots S'''_N$. The extracted symbols $S'''(N)$ may correspond to the symbols $S(N)$, the extracted symbols $S'''(N)$ may be affected by the noise. In certain non-limiting embodiments, the receiver symbol processor 118 may perform operations (such as down sampling, demodulation, or the like) to reverse the operations performed by the transmitter symbol processor 110.

The receiver symbol processor 118 may forward the extracted process the extracted N non-binary symbols $S'''(N)=S'''_1, S'''_2, S'''_3, \ldots S'''_N$ to the symbols-to-LLR convertor 120. The symbols-to-LLR convertor 120 may convert the symbols $S'''(N)$ to $LLR(M)=LLR_1, LLR_9, LLR_2 \ldots LLR_M$. It is to be noted that $LLR_1$ may correspond to the encoded message bit $C_1$, $LLR_9$ may correspond to the encoded message bit $C_9$, and so on.

The symbols-to-LLR convertor 120 may forward the $LLR(M)=LLR_1, LLR_9, LLR_2 \ldots LLR_M$ to the deinterleaver 122. The deinterleaver 122 may rearrange the $LLR(M)=LLR_1, LLR_9, LLR_2 \ldots LLR_M$ to generate M rearranged $LLR'(M)=LLR_1, LLR_2, LLR_3 \ldots LLR_M$. In certain non-limiting embodiments, the deinterleaver 122 is configured to invert the effects of the interleaving performed by the interleaver 106. In so doing, the deinterleaver 122 may rearrange the M LLRs in such a manner that M rearranged $LLR'(M)=LLR_1, LLR_2, LLR_3$ correspond to the encoded message bits sequence $C(M)$.

The deinterleaver 122 may forward the M rearranged $LLR'(M)=LLR_1, LLR_2, LLR_3$ to the polar decoder 124. The polar decoder 124 may perform polar decoding over the M rearranged $LLR'(M)=LLR_1, LLR_2, LLR_3$ to generate K message bits $u'(K)=u'_1, u'_2, u'_3, \ldots u'_K$ manifesting the original K message bits $u(K)=u_1, u_2, u_3, \ldots u_K$.

Thus, by virtue of communication system 100, the original K message bits $u(K)=u_1, u_2, u_3, \ldots u_K$ may be transmitted over the information bit channels 114 selected by the process 200 in such a manner that the K message bits $u(K)=u_1$ when received by the receiver 116, BER is significantly improved.

Figure 4:
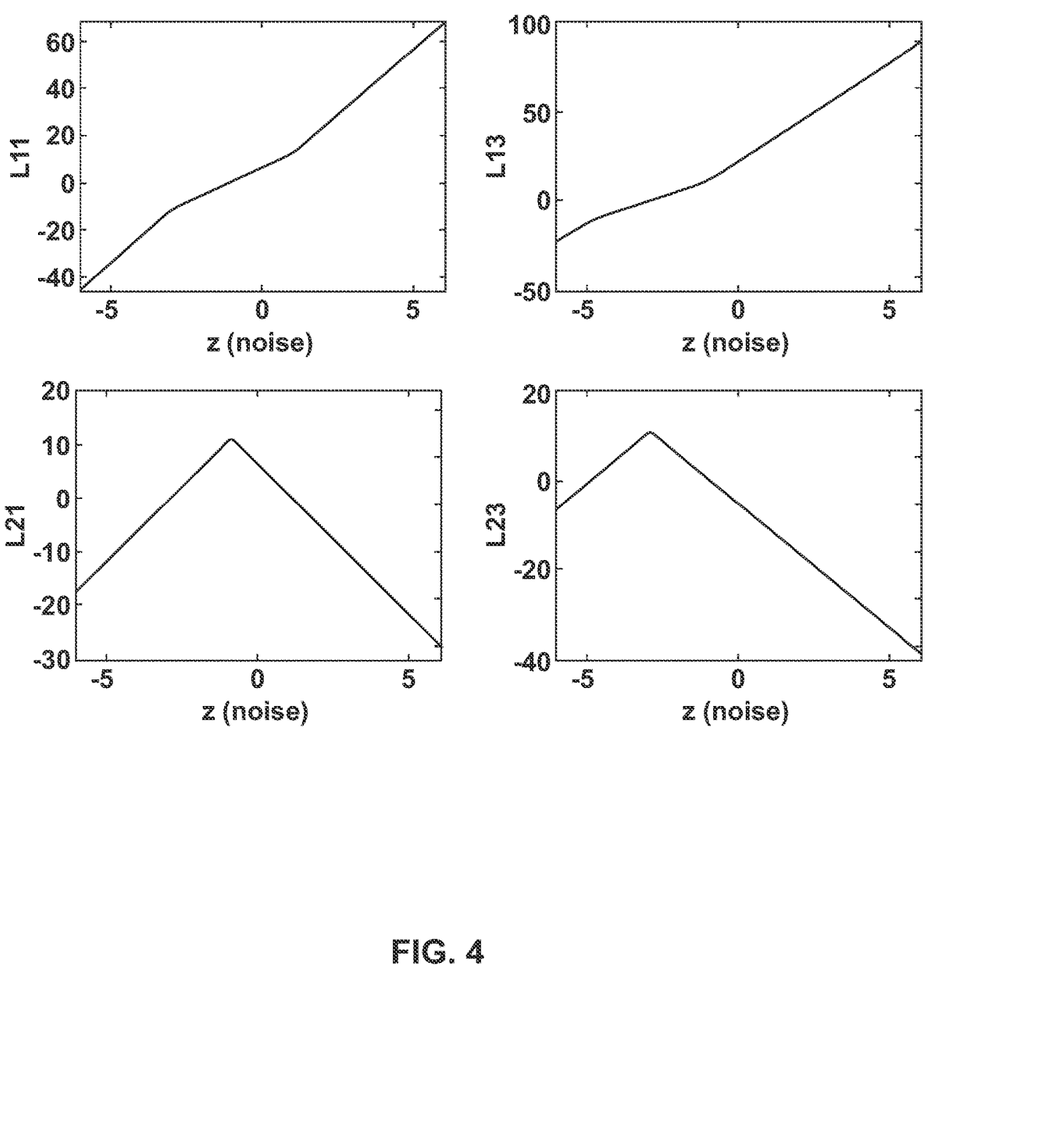
FIG. 4 illustrates different conditional LLRs versus noise, in accordance with various non-limiting embodiments of the present disclosure.

FIG. 4 illustrates different conditional LLRs versus noise, in accordance with various non-limiting embodiments of the present disclosure. FIG. 4 illustrates the conditional LLRs versus the amount of noise.

Figure 5:
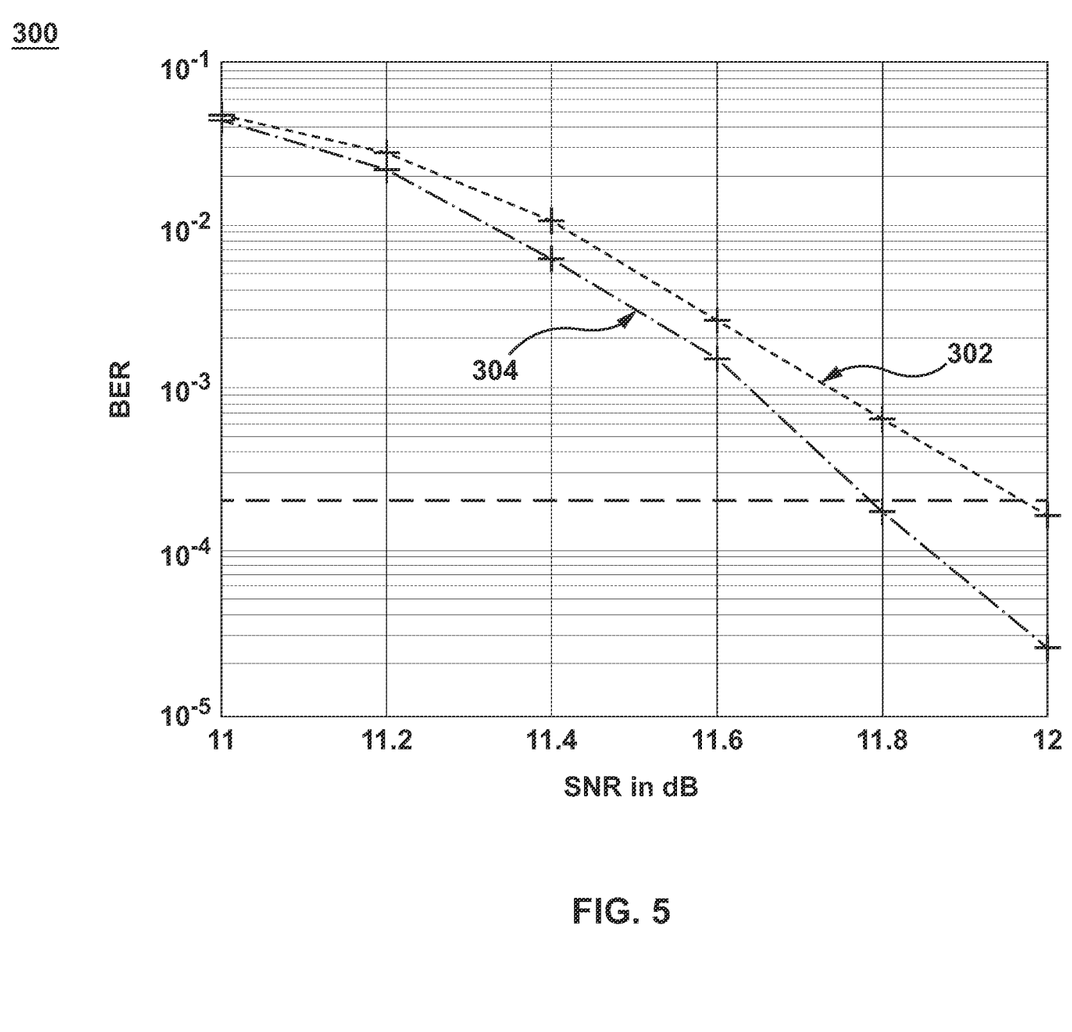
FIG. 5 illustrates simulation results for 4-Amplitude Shift Keying (4-ASK) binary interleaved coded modulation (BICM), in accordance with various non-limiting embodiments.

FIG. 5 illustrates simulation results 300 for 4-Amplitude Shift Keying (4-ASK) binary interleaved coded modulation (BICM), in accordance with various non-limiting embodiments. As shown, the simulation results 302 corresponds to simulation results in accordance with a conventional technique and the simulation results 304 corresponds to simulation result in accordance with techniques as disclosed in the present disclosure.

Figure 6:
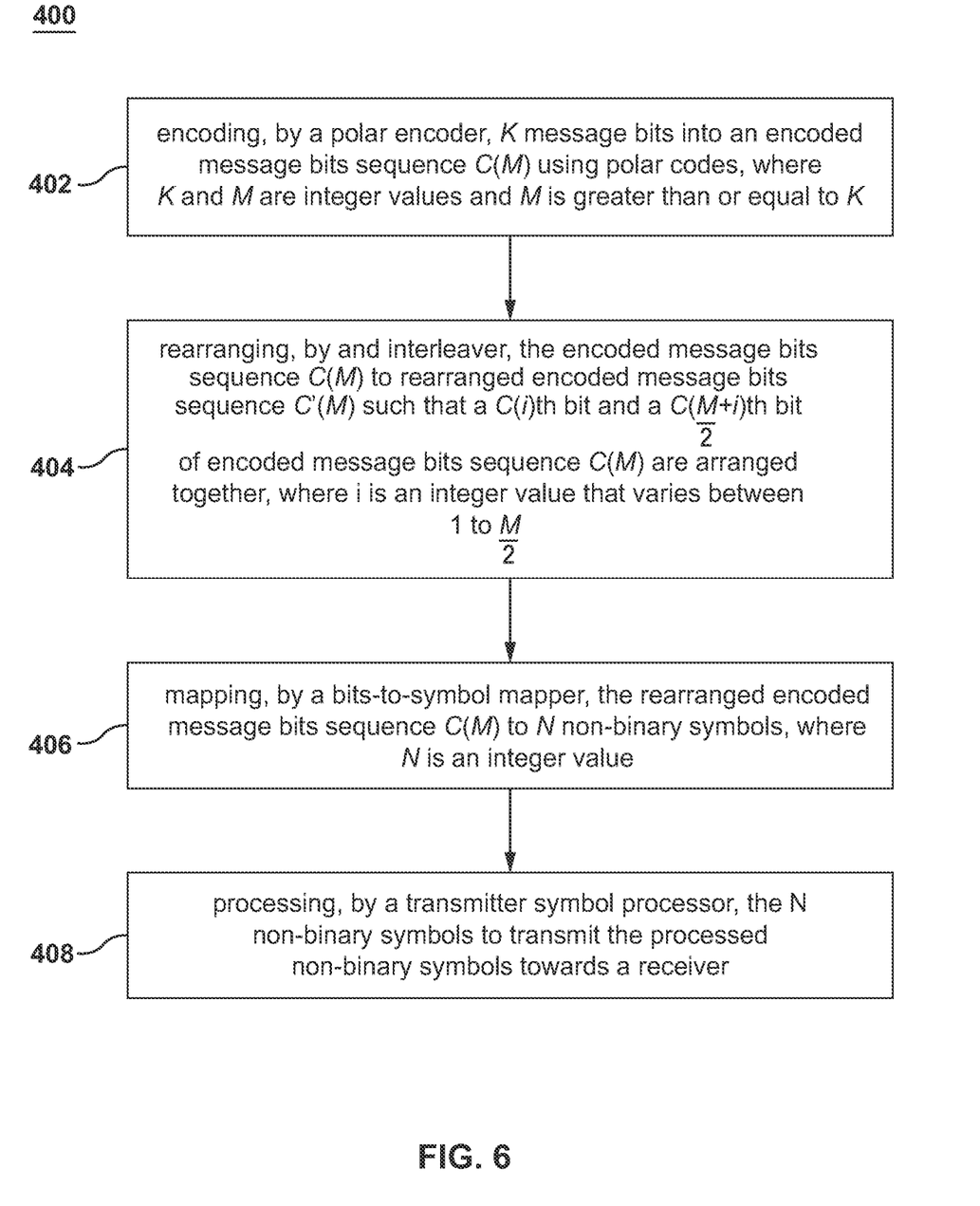
FIG. 6 depict a flowchart of a process representing a method for encoding digital communication, in accordance with various non-limiting embodiments of the present disclosure.

FIG. 6 depict a flowchart of a process 400 representing a method for encoded digital communications, in accordance with various non-limiting embodiments of the present disclosure. As shown, the process 400 commences at step 402, where a polar encoder encodes K message bits into an encoded message bits sequence $C(M)$ using polar codes, where K and M are integer values and M is greater than or equal to K. As previously noted, the polar encoder 104 encodes K message bits into the encoded message bits sequence $C(M)$ using polar codes.

The process 400 advances to step 404, where an interleaver rearranges the encoded message bits sequence $C(M)$ to rearranged encoded message bits sequence $C'(M)$ such that a $C(i)$th bit and a $$C\left(\frac{M}{2}+i\right)$$

th bit of the encoded message bits sequence $C(M)$ are arranged together, where i is an integer value that varies between 1 to $$\frac{M}{2}.$$

As noted above, the interleaver 106 rearranges the encoded message bits sequence $C(M)$ to rearranged encoded message bits sequence $C'(M)$.

The process 400 moves to step 406, where a bits-to-symbol mapper maps the rearranged encoded message bits sequence $C(M)$ to N non-binary symbols, where N is an integer value. As previously discussed, the bits-to-symbol mapper 108 maps the rearranged encoded message bits sequence $C(M)$ to N non-binary symbols.

Finally, the process 400 proceeds to step 408, where a transmitter symbol processor processes the N non-binary symbols to transmit the processed non-binary symbols across a communications medium towards a receiver. As previously discussed, the transmitter symbol processor 110 process the N non-binary symbols to transmit the processed non-binary symbols towards the receiver 116.

It is to be understood that the operations and functionality of the communication system 100, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifi-

What is claimed is:

1. A communication system comprising:
   a transmitter including:
      a polar encoder configured to encode K message bits u(K) into an encoded message bits sequence C(M) using polar codes, where K is an integer value, M is an even integer value and M is greater than or equal to K;
      an interleaver configured to rearrange the encoded message bits sequence C(M) to generate rearranged encoded message bits sequence C'(M) such that a C(i)th bit and a $$C\left(\frac{M}{2}+i\right)$$

th bit of the encoded message bits sequence C(M) are arranged together, where i is an integer value that varies between 1 to $$\frac{M}{2};$$

a bits-to-symbol mapper configured to map the rearranged encoded message bits sequence C'(M) to N non-binary symbols, where N is an integer value;
      a transmitter symbol processor configured to process the N non-binary symbols to transmit the N processed non-binary symbols towards a receiver; and
   wherein:
      at least some of bit channels associated with the polar encoder are frozen bit channels and remaining bit channels are information bit channels,
      the frozen bit channels and the information bit channels are selected based on a selection process,
      the selection process includes operating the communication system in offline mode, and
      selecting M offline codewords as output of the polar encoder, such that when the M offline codewords are converted to N offline non-binary symbols, by the bits-to-symbol mapper, an average power of the N offline non-binary symbols is equal to an average power of the N available non-binary symbols with the bits-to-symbol mapper.

2. The communication system of claim 1, wherein the transmitter symbol processor is further configured to modulate the N non-binary symbols.

3. The communication system of claim 1, wherein the processed N non-binary symbols are transmitted over a wireless medium.

4. The communication system of claim 1, wherein the processed N non-binary symbols are transmitted over an optical medium.

5. The communication system of claim 1 further comprising a receiver, the receiver including:
   a receiver symbol processor configured to receive the N processed non-binary symbols and extract the N non-binary symbols;
   a symbols-to-log-likelihood ratio (LLR) convertor configured to convert the N non-binary symbols to M LLRs, where the M LLRs are real values;
   a deinterleaver configured to rearrange the M LLRs in such a manner that the M rearranged LLRs correspond to the encoded message bits sequence C(M); and
   a polar decoder configured to decode the M rearranged LLRs and generate K bits manifesting the K message bits.

6. The communication system of claim 5, wherein the selection process further includes:
   processing, by the transmitter symbol processor, the N offline non-binary symbols and transmitting the N processed offline non-binary symbols towards the receiver;
   extracting, by the receiver symbol processor, the N offline non-binary symbols from the N processed offline non-binary symbols;
   converting, by the symbols-to-LLR convertor, the N offline non-binary symbols to M offline LLRs;
   decoding, by the polar decoder, the M offline LLRs and generating M offline bits such that the M offline bits correspond to M offline message bits;
   computing probability of errors corresponding to the bit channels associated with the polar encoder based on a noise correlation between the M offline LLRs; and
   selecting, by the polar decoder, K bit channels having a lower the probability of errors than M-K bit channels as the information bit channels and remaining M-K bit channels are selected as frozen bit channels.

7. The communication system of claim 5, wherein the receiver symbol processor is further configured to demodulate the N non-binary symbols.

8. The communication system of claim 1, wherein the information bit channels are used for encoding the K message bits and no information bit is mapped onto the frozen bit channels.

9. A method of communication comprising:
   encoding, by a polar encoder, K message bits into an encoded message bits sequence C(M) using polar codes, where K is an integer value, M is an even integer value and M is greater than or equal to K;
   rearranging, by an interleaver, the encoded message bits sequence C(M) to rearranged encoded message bits sequence C'(M) such that a C(i)th bit and a $$C\left(\frac{M}{2}+i\right)$$

th bit of the encoded message bits sequence C(M) are arranged together, where i is an integer value that varies between 1 to $$\frac{M}{2};$$

mapping, by a bits-to-symbol mapper, the rearranged encoded message bits sequence C(M) to N non-binary symbols, where N is an integer value;
   processing, by a transmitter symbol processor, the N non-binary symbols to transmit the processed non-binary symbols towards a receiver; and
   wherein:
      at least some of bit channels associated with the polar encoder are frozen bit channels and remaining bit channels are information bit channels, the frozen bit channels and the information bit channels are selected based on a selection process, the selection process includes operating the communication system in offline mode, selecting M offline codewords as output of the polar encoder, such that when the M offline codewords are converted to N offline non-binary symbols, by the bits-to-symbol mapper, an average power of the N offline non-binary symbols is equal to an average power of the N available non-binary symbols with the bits-to-symbol mapper.

10. The method of communication of claim 9, further comprising modulating the N non-binary symbols.

11. The method of communication of claim 9, further comprising transmitting the processed N non-binary symbols over a wireless medium.

12. The method of communication of claim 9, further comprising transmitting the processed N non-binary symbols over an optical medium.

13. The method of communication of claim 9 further comprising:

receiving, by a receiver symbol processor, the N processed non-binary symbols;

extracting by the receiver symbol processor, the N non-binary symbols from the N processed non-binary symbols;

converting, by a symbols-to-log-likelihood ratio (LLR), the N non-binary symbols to M LLRs, where the M LLRs are real;

rearranging, by a deinterleaver, the M LLRs in such a manner that the M rearranged LLRs correspond to the encoded message bits sequence C(M); and decoding, by a polar decoder, the M rearranged LLRs and generate K bits manifesting the K message bits.

14. The method of communication of claim 13, wherein the selection process further includes:

processing, by the transmitter symbol processor, the N offline non-binary symbols and transmitting the N processed offline non-binary symbols towards the receiver;

extracting, by the receiver symbol processor, the N offline non-binary symbols from the N processed offline non-binary symbols;

converting, by the symbols-to-LLR convertor, the N offline non-binary symbols to M offline LLRs;

decoding, by the polar decoder, the M offline LLRs and generating M offline bits such that the M offline bits correspond to M offline message bits;

computing probability of errors corresponding to the bit channels associated with the polar encoder based on a noise correlation between the K offline LLRs; and selecting, by the polar decoder, K bit channels having a lower the probability of errors than M-K bit channels as the information bit channels and remaining M-K bit channels are selected as frozen bit channels.

15. The method of communication of claim 13, wherein the receiver symbol processor is further configured to demodulate the N non-binary symbols.

16. The method of communication of claim 1, wherein the information bit channels are used for encoding the K message bits and no information bit is mapped onto the frozen bit channels.

* * * * *